United States Patent
Kodama (10) Patent No.: US 9,001,610 B2
(45) Date of Patent: Apr. 7, 2015

(54) SEMICONDUCTOR DEVICE GENERATING INTERNAL VOLTAGE

(75) Inventor: Takuyo Kodama, Tokyo (JP)

(73) Assignee: PS4 Luxco S.a.r.l., Luxembourg (LU)

( * ) Notice: Subject to any disclaimer, the term of this patent is extended or adjusted under 35 U.S.C. 154(b) by 400 days.

(21) Appl. No.: 13/316,293

(22) Filed: Dec. 9, 2011

(65) Prior Publication Data

US 2012/0155207 A1    Jun. 21, 2012

(30) Foreign Application Priority Data

Dec. 17, 2010    (JP) .................................. 2010-281491

(51) Int. Cl.
- G11C 5/14 (2006.01)
- G11C 11/24 (2006.01)
- H03K 19/00 (2006.01)

(52) U.S. Cl.
CPC ............ *H03K 19/0016* (2013.01); *G11C 5/145* (2013.01); *G11C 5/147* (2013.01)

(58) Field of Classification Search
CPC .................................. G11C 5/14; G11C 11/24
USPC .............. 365/149, 189.11, 189.09, 194, 205, 365/207, 230.06, 222, 226, 227, 229; 327/540, 541, 544, 546

See application file for complete search history.

(56) References Cited

U.S. PATENT DOCUMENTS

| | | | |
|---|---|---|---|
| 3,959,782 A * | 5/1976 | Dunn | 365/149 |
| 5,451,897 A * | 9/1995 | Komuro | 327/544 |
| 6,297,624 B1 | 10/2001 | Mitsui et al. | |
| 6,320,810 B1 | 11/2001 | Kono et al. | |
| 7,307,469 B2 | 12/2007 | Yamada et al. | |
| 7,468,624 B2 | 12/2008 | Yamada et al. | |
| 2002/0167350 A1* | 11/2002 | Sato et al. | 327/540 |
| 2006/0104144 A1* | 5/2006 | Byeon et al. | 365/226 |

FOREIGN PATENT DOCUMENTS

| | | |
|---|---|---|
| JP | 05-062481 A | 3/1993 |
| JP | 11-096758 A | 4/1999 |
| JP | 2000-011649 A | 1/2000 |
| JP | 2001-084765 A | 3/2001 |
| JP | 2006-039816 A | 2/2006 |
| JP | 2006-139851 A | 6/2006 |
| JP | 2008-310951 A | 12/2008 |

* cited by examiner

Primary Examiner — Richard Elms
Assistant Examiner — Ajay Ojha
(74) Attorney, Agent, or Firm — McGinn IP Law Group, PLLC (57) ABSTRACT

Such a device is disclosed that includes an internal voltage generating circuit generating an internal voltage by lowering an external potential and supplying the generated internal voltage to a power supply line, a switch being connected between a grounding wire to which a ground voltage is supplied and the power supply line, and a one-shot signal generating unit controlling turning on and off of the switch, wherein the one-shot signal generating unit brings the switch into conduction synchronously with start of generating the internal voltage by the internal voltage generating circuit.

26 Claims, 8 Drawing Sheets

SEMICONDUCTOR DEVICE GENERATING INTERNAL VOLTAGE

BACKGROUND OF THE INVENTION

1. Field of the Invention

The present invention relates to a semiconductor device, and more particularly relates to a semiconductor device that generates an internal voltage.

2. Description of Related Art

In semiconductor devices such as a DRAM (Dynamic Random Access Memory), an internal voltage generating circuit is used to generate an internal voltage from an external power supply voltage. The internal voltage generating circuit includes a differential amplifier having a current mirror circuit, and a driver transistor having a control terminal that is connected to an output terminal of the differential amplifier. An internal voltage that is equivalent to a reference voltage is generated by these elements.

The internal voltage generating circuit is normally configured to be activated only when it is necessary so as to reduce its power consumption. The activation of the internal voltage generating circuit is performed by turning on a current supply transistor that is connected between a common source of a differential amplifier and a grounding wire. When the current supply transistor is turned on, a current flows into the current mirror circuit in the differential amplifier and then the drive transistor is turned on, thereby generating an internal voltage. Examples of such a voltage generating circuit that performs activation control are disclosed in Japanese Patent Applications Laid-open Nos. H5-62481, 2001-84765, and H11-96758.

In recent years, along with the increase in processing speeds of semiconductor devices, the permissible period of time required to stabilize an internal voltage from immediately after activating an internal voltage generating circuit has become very short (hereinafter, the period of time is referred to as "stabilization time of an internal voltage"). As a DRAM is exemplified, in a DLL (Delay Locked Loop) circuit that generates an internal clock signal LCLK for outputting data to outside, the stabilization time of the internal clock signal LCLK (the period of time required to stabilize the internal clock signal LCLK from immediately after activating the internal voltage generating circuit) is only 24 nanoseconds. Therefore, there remains only a shorter time as the stabilization time of an internal voltage VPERD, which is an operation power supply voltage of the DLL circuit.

However, in the conventional semiconductor device described above, there are cases that such a short stabilization time cannot be realized. That is, while the internal voltage generating circuit is configured to be activated at the same time as the semiconductor device is returned from a power-down mode, a circuit that is a supply destination of an internal voltage is also activated at the time. Therefore, current consumption is started immediately after activating the internal voltage generating circuit. However, because the internal voltage generating circuit is not stable immediately after its activation, an output potential of the internal voltage generating circuit is reduced for a while. The reduced output potential is returned to an original level after a certain period of time; however, when the current consumption amount of the supply destination circuit is small, the degree of reduction in the output potential becomes small and thus reaction of a potential of the output terminal of the differential amplifier is slowed, thereby causing a requirement of a long time for the reduced output potential to return to the original level. As a result, the short stabilization time mentioned above cannot be realized.

Consequently, there has been a demand for a technique that enables to stabilize an internal voltage in a short time, regardless of the current consumption amount of a supply destination circuit.

SUMMARY

In one embodiment, there is provided a semiconductor device that includes: a first power supply line; an internal voltage generating circuit receiving a first external power supply voltage and generating an internal voltage in response to the first external power supply voltage, the internal voltage generating circuit supplying the internal voltage to the first power supply line; a second power supply line supplied with a second external power supply voltage lower than the internal voltage; a switch connected between the first power supply line and the second power supply line; and a control circuit bringing the switch into a conductive state when the internal voltage generating circuit starts generating the internal voltage, and keeping the switch the conductive state during a first period of time.

In another embodiment, there is provided a semiconductor device that includes: an internal voltage generating circuit including an output node, the internal voltage generating circuit supplying an internal power supply voltage to the output node in response to a first signal; and a first circuit supplying a first voltage being lower than the internal power supply voltage to the output node of the internal voltage generating circuit in response to the first signal during a first period of time.

In another embodiment, there is provided a device that includes: a first power supply line; an internal voltage generating circuit activated in response to a first signal, the internal voltage generating circuit, when activated, supplying an internal power supply voltage to the first power supply line; a first circuit supplying a first voltage in response to the first signal during a first period of time, the first voltage being lower than the internal power supply voltage to the first power supply line; a clock generating circuit operating on the internal power supply voltage to generate a first clock signal; a memory cell array; and an output circuit outputting data that is supplied from the memory cell array in response to the first clock signal.

DETAILED DESCRIPTION OF THE EMBODIMENTS

Preferred embodiments of the present invention will be explained below in detail with reference to the accompanying drawings.

Figure 1:
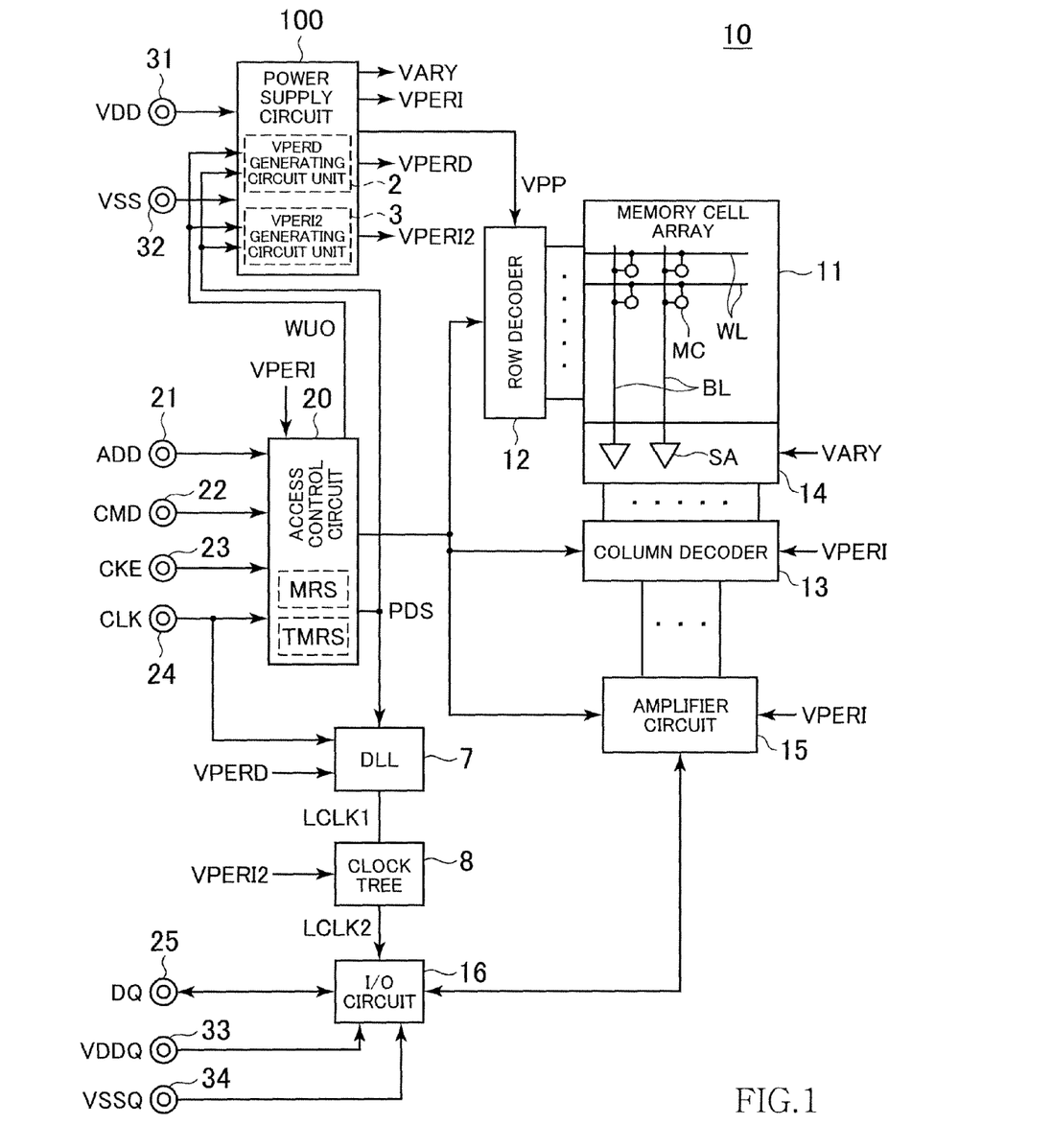
FIG. 1 is a block diagram indicative of an embodiment of a configuration of a semiconductor device 10.

Referring now to FIG. 1, the semiconductor device 10 according to an embodiment of the present invention is a DRAM, and includes a memory cell array 11 as shown in FIG. 1. A plurality of word lines WL and a plurality of bit lines BL are provided in the memory cell array 11 in an intersecting manner, and a memory cell MC is arranged at each of the intersections. Selection of the word lines WL is performed by a row decoder 12 and selection of the bit lines BL is performed by a column decoder 13. The bit lines BL are respectively connected to corresponding sense amplifiers SA in a sensing circuit 14, and the bit line BL selected by the column decoder 13 is connected to an amplifier circuit 15 via the sense amplifier SA.

Operations of the row decoder 12 and the column decoder 13 are controlled by an access control circuit 20. The access control circuit 20 receives an address signal ADD and a command signal CMD respectively supplied from outside via an address terminal 21 and a command terminal 22, synchronously with an external clock input from a clock terminal 24. The access control circuit 20 controls the row decoder 12 and the column decoder 13 based on the address signal ADD and the command signal CMD. The access control circuit 20 also controls operations of the amplifier circuit 15.

Specifically, when the command signal CMD indicates an active operation, the address signal ADD is supplied to the row decoder 12. In response to this, the row decoder 12 selects a word line WL indicated by the address signal ADD, and thus corresponding memory cells MC are respectively connected to the bit lines WL. When the command signal CMD indicates a read operation or a write operation, the address signal ADD is supplied to the column decoder 13. In response to this, the column decoder 13 connects a bit line BL indicated by the address signal ADD to the amplifier circuit 15. When the command signal CMD indicates a read operation, read data DQ is read from the memory cell array 11 via the sense amplifier SA, and the read data DQ passes through the amplifier circuit 15 and an input/output circuit 16 to be output to outside from a data terminal 25. When the command signal CMD indicates a write operation, write data DQ is supplied from outside via the data terminal 25, and the write data DQ passes through the input/output circuit 16, the amplifier circuit 15, and the sense amplifier SA to be written in the memory cell MC.

In response to a clock enable signal CKE input from a clock enable terminal 23, the access control circuit 20 supplies a power-down signal PDS to a power supply circuit 100 and a DLL circuit 7. Specifically, when the clock enable signal CKE is at a high level, the access control circuit 20 sets the power-down signal PDS to a low level, that is, an inactive level, so as to set the semiconductor device 10 to be in a power-down mode. When the clock enable signal CKE is at a low level, the access control circuit 20 sets the power-down signal PDS to a high level, that is, an active level, so as to set the semiconductor device 10 to be in an active state. The access control circuit 20 further generates a wake-up off signal WUO that is a signal for switching between an active state and an inactive state of a VPERD-stabilization enhancing circuit 50 and a VPERI2-stabilization enhancing circuit 55 (these circuits are explained later), which are included respectively in a VPERD generating circuit unit 2 and a VPERI2 generating circuit unit 3 in the power supply circuit 100. The access control circuit 20 sets the level (high level or low level) of the wake-up off signal WUO to, for example, a level according to setting of a mode register circuit MRS or a test-mode register circuit TMRS included in the access control circuit 20.

The DLL circuit 7 generates an internal clock signal LCLK1 for synchronizing timing of data output by the input/output circuit 16 with an external clock input from the clock terminal 24. The generated internal clock signal LCLK1 is supplied to a clock tree 8 and is distributed by the clock tree 8 as an internal clock signal LCLK2 to a plurality of output circuits (not shown) in the input/output circuit 16.

The access control circuit 20 switches between an active state and an inactive state of the DLL circuit 7 by switching between an active level and an inactive level of the power-down signal PDS. Specifically, when the power-down signal PDS is at the inactive level, the DLL circuit 7 is set to be in the active state, and when the power-down signal PDS is at the active level, the DLL circuit 7 is set to be in the inactive state.

The circuit blocks described above use respective predetermined internal voltages as an operation power supply. These internal voltages are generated by the power supply circuit 100 shown in FIG. 1. The power supply circuit 100 receives an external potential VDD (a first external power supply voltage) and a ground potential VSS (a second external power supply voltage) that are supplied respectively through power supply terminals 31 and 32, and generates internal voltages VPP, VPERI, VPERI2, VPERD, VARY, and the like based on these potentials. In the present specification, VDD, VPP, VPERI, VPERI2, VPERD, and VARY indicate the levels of these voltages, and also indicate potential differences (voltages) with respect to the ground potential VSS. For example, "VDD" indicates the voltage level itself of the external potential VDD, as well as a potential difference (voltage) with respect to the ground potential VSS. The same is true for VPP, VPERI, VPERI2, VPERD, and VARY. In the present embodiment, VPP>VDD>VPERI=VPERI2=VPERD= VARY>VSS is established.

The internal voltage VPP is used in the row decoder 12. The row decoder 12 drives a word line WL selected based on the address signal ADD to be at the VPP level, thereby turning on a cell transistor included in the memory cell MC. The internal voltage VARY is used in the sensing circuit 14. When the sensing circuit 14 is activated, amplification of read-out read data is performed by driving one bit line of a bit line pair to be at the VARY level and driving the other bit line to be at the VSS level. The internal voltage VPERI is used as an operating voltage of most of peripheral circuits such as the access control circuit 20. Lower power consumption is achieved by using the internal voltage VPERI, which is lower than the external potential VDD, as the operating voltage of these peripheral circuits.

The input/output circuit 16 operates upon receipt of an external potential VDDQ and a ground potential VSSQ that are supplied respectively via power supply terminals 33 and 34. In the present embodiment, the voltage level of the external potential VDDQ is equal to VDD, and the voltage level of the ground potential VSSQ is equal to VSS. In this manner, by supplying external power to the input/output circuit 16 from the power supply terminal that is different from the power supply terminal that supplies external power to other circuits, superimposition of noise generated by operations of other circuits on the input/output circuit is suppressed.

The internal voltage VPERD is used as an operating voltage of the DLL circuit 7. Preferably, the internal voltage VPERD is used as an operating voltage of a delay circuit unit, which is a circuit included in the DLL circuit 7 and generates the internal clock signal LCLK1. The internal voltage VPERI2 is used as an operating voltage of the clock tree 8. To the DLL circuit 7 and the clock tree 8, the corresponding unique internal voltages VPERD and VPERI2 are respectively supplied instead of the internal voltage VPERI to prevent superimposition of noise on the internal clock signal LCLK1 through a power supply line.

Figure 2:
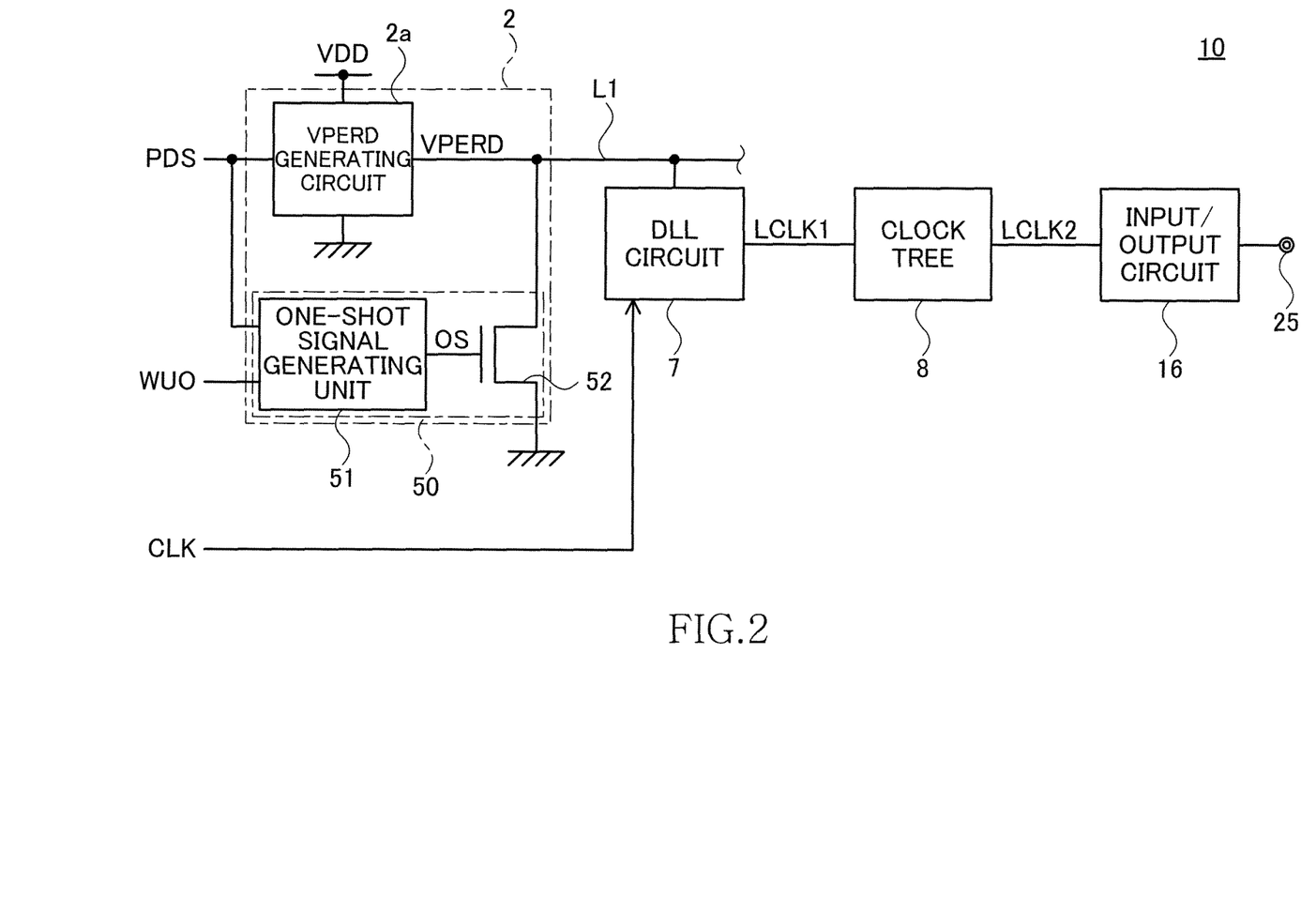
FIG. 2 is a block diagram indicative of an embodiment of the VPERD generating circuit unit 2 that generates the internal voltage VPERD and other blocks related thereto out of circuit blocks included in the semiconductor device 10 shown in FIG. 1.

Turning to FIG. 2, the VPERD generating circuit unit 2 (an internal voltage generating circuit unit) according to the present embodiment includes a VPERD generating circuit 2a and the VPERD-stabilization enhancing circuit 50. The VPERD-stabilization enhancing circuit 50 includes a one-shot signal generating unit 51 (a switch control circuit) and a switch 52.

As shown in FIG. 2, the VPERD generating circuit 2a is connected between a power supply line (a third power supply line) to which the external potential VDD is supplied and a grounding wire (a second power supply line) to which the ground potential VSS is supplied, and generates the internal voltage VPERD from the external potential VDD to supply the generated internal voltage VPERD to the a power supply line L1 (a first power supply line). The power-down signal PDS (an inverted signal of a given activation signal) that is activated (that is, at a high level) when the semiconductor device 10 is in a power-down mode and is inactivated (that is, at a low level) otherwise is supplied to the VPERD generating circuit 2a from the access control circuit 20. The VPERD generating circuit 2a is configured to start generating the internal voltage VPERD in response to inactivation of the power-down signal PDS (activation of the activation signal).

Figure 3:
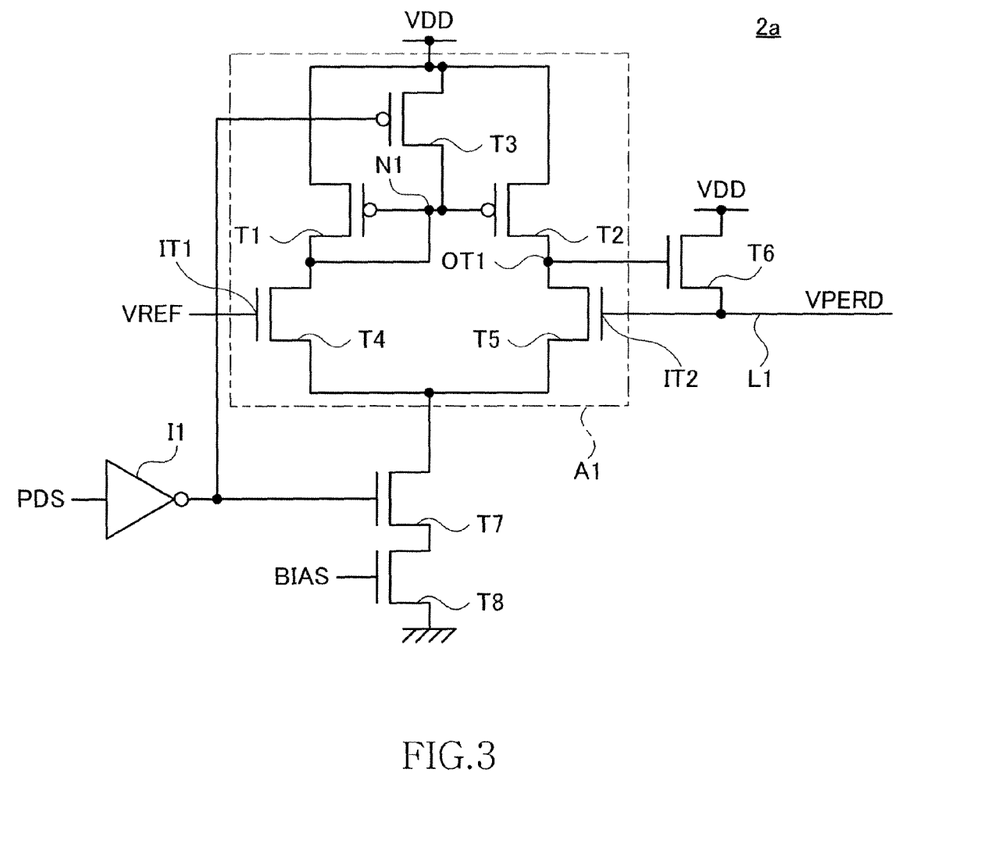
FIG. 3 is a circuit diagram indicative of an embodiment of an internal configuration of the VPERD generating circuit 2a shown in FIG. 2.

Turning to FIG. 3, the VPERD generating circuit 2a includes P-channel MOS transistors T1 to T3 and N-channel MOS transistors T4 to T8.

The transistors T1, T2, T3, T4, and T5 constitute a differential amplifier A1. A gate (a control terminal) of the transistor T4 constitutes a first input terminal IT1 of the differential amplifier A1, and receives supply of a reference voltage VREF (a target voltage of the internal voltage VPERD) of the internal voltage VPERD from a reference-voltage generating source (not shown). A gate of the transistor T5 constitutes a second input terminal IT2 of the differential amplifier A1, and is connected to the power supply line L1. A source (one of controlled terminals) of the transistor T4 and a source of the transistor T5 are connected to each other and the both sources constitute a common source of the differential amplifier A1. This common source is connected via the transistors T7 and T8 to the grounding wire to which the ground potential VSS is supplied. A drain (the other one of the controlled terminals) of the transistor T5 constitutes an output terminal OT1 of the differential amplifier A1.

The transistors T1 and T2 are connected respectively between drains of the transistors T4 and T5 and a power supply line to which the external potential VDD is supplied. The transistors T1 and T2 are connected in a current mirror manner. That is, a gate of the transistor T1 and a gate of the transistor T2 are short-circuited by a node N1, and the node N1 is connected to a drain of the transistor T1. The node N1 is also connected via the transistor T3 to the power supply line to which the external potential VDD is supplied.

With the above configurations, the differential amplifier A1 controls the potential of the output terminal OT1 in such a manner that the potential of the second input terminal IT2 becomes equal to that of the first input terminal IT1.

The transistor T6 is connected between the power supply line to which the external potential VDD is supplied and the power supply line L1, and functions as a driver transistor that supplies a voltage to the power supply line L1. Specifically, when the transistor T6 is turned on, the external potential VDD is supplied to the power supply line L1 via the transistor T6. On the other hand, when the transistor T6 is turned off, supply of the external potential VDD to the power supply line L1 is stopped. A gate of the transistor T6 is connected to the output terminal OT1 of the differential amplifier A1, and turning on/off and a drain current value of the transistor T6 is controlled by the potential of the output terminal OT1.

When the potential of the power supply line L1 becomes smaller than the reference voltage VREF, the differential amplifier A1 raises the potential of the output terminal OT1 and turns on the transistor T6. With this operation, the external potential VDD is supplied to the power supply line L1 and the potential of the power supply line L1 is increased. On the other hand, when the potential of the power supply line L1 becomes larger than the reference voltage VREF, the differential amplifier A1 lowers the potential of the output terminal OT1 and turns off the transistor T6. With this operation, supply of the external potential VDD to the power supply line L1 is stopped and the potential of the power supply line L1 is reduced. The potential of the power supply line L1 is maintained as equal as the reference voltage VREF generally according to the above principles.

The transistors T7 and T8 are connected in series between the common source of the differential amplifier A1 and the grounding wire to which the ground potential VSS is supplied, and function as current supplying transistors that supply a current to the differential amplifier A1. That is, when the transistors T7 and T8 are turned on, the common source of the differential amplifier A1 is connected to the grounding wire and thus a current flows into the transistors T1 and T2. On the other hand, when the transistors T7 and T8 are turned off, the common source of the differential amplifier A1 is disconnected from the grounding wire, and thus no current flows into the transistors T1 and T2. The transistor T8 is always maintained to be on because a fixed voltage BIAS is constantly supplied thereto. The transistor T8 is provided in order to keep a direct current flowing into the differential amplifier A1 to be equal to or lower than a predetermined value.

An inverted signal of the power-down signal PDS described above is supplied to a gate of the transistor T7 via an inverter I1. The inverted signal of the power-down signal PDS is also supplied to a gate of the transistor T3. With this configuration, when the semiconductor device 10 returns from the power-down mode, the transistor T3 is turned off and the node N1 is disconnected from the external potential VDD while the transistor T7 is turned on and a current starts to flow into the differential amplifier A1. Consequently, generation of the internal voltage VPERD by the VPERD generating circuit 2a is started, and the potential of the power supply line L1 is raised to the level of the internal voltage VPERD. On the other hand, when the semiconductor device 10 is brought into the power-down mode, the transistor T3 is turned on, and thus the potential of the node N1 becomes equal to the external potential VDD and then the transistors T1 and T2 are turned off. Further, the transistor T7 is turned off and the current flowing into the differential amplifier A1 is stopped. As a result, the generation of the internal voltage VPERD by the VPERD generating circuit 2a is stopped.

In this case, when the semiconductor device 10 returns from the power-down mode, not only the VPERD generating circuit 2a but also the DLL circuit 7 are activated. Therefore, current consumption is started in the DLL circuit immediately after activation of the VPERD generating circuit 2a. However, because the VPERD generating circuit 2a is not stable immediately after starting its operation, the potential of the power supply line L1 is reduced for a while. The reduced potential is returned to the original level after a certain period of time. At that time, when the current consumption amount of the DLL circuit 7 is small, the degree of reduction in the potential becomes small and thus reaction of the potential of the output terminal OT1 of the differential amplifier A1 is slowed, thereby causing a requirement of a long time for the potential of the output terminal OT1 to return to the original level (a target voltage).

The above case is explained more specifically. When drain currents of the transistors T1, T2, T4, and T5 are represented as $I_{T1}$, $I_{T2}$, $I_{T4}$, and $I_{T5}$, respectively, $I_{T1}:I_{T2}=I_{T4}:I_{T5}$ is established in an equilibrium state because the transistors T1 and T2 have a current mirror configuration. At that time, the potential of the output terminal OT1 is controlled in such a manner that the potential of the power supply line L1 becomes equal to the reference voltage VREF. That is, when the potential of the power supply line L1 is reduced, the drain current of the transistor T5 is decreased and therefore the balance of $I_{T1}:I_{T2}=I_{T4}:I_{T5}$ is lost. As a result, the potential of the output terminal OT1 is raised and the drain current of the transistor T6 is increased, which raises the potential of the power supply line L1.

Because a certain period of time is required for the differential amplifier A1 to return to the equilibrium state, it takes a certain period of time for the reduced potential of the power supply line L1 to return to a normal value. The period of time becomes longer as the current consumption amount of the DLL circuit 7 is smaller. The reason for this is that a decreasing ratio of the potential of the power supply line L1 becomes smaller as the current consumption amount of the DLL circuit 7 is smaller, and this leads to reduction in a raising ratio of the potential of the output terminal OT1 and thus an increasing amount of the drain current of the transistor T6 becomes smaller. When the semiconductor device 10 returns from the power-down mode, the power supply line L1 and the grounding wire are short-circuited for a while by the VPERD-stabilization enhancing circuit 50. That is, because the potential of the power supply line L1 is greatly reduced for a while forcibly, the internal voltage VPERD can be stabilized in a short time regardless of the current consumption amount of the DLL circuit 7. The VPERD-stabilization enhancing circuit 50 is explained next in detail.

Figure 4:
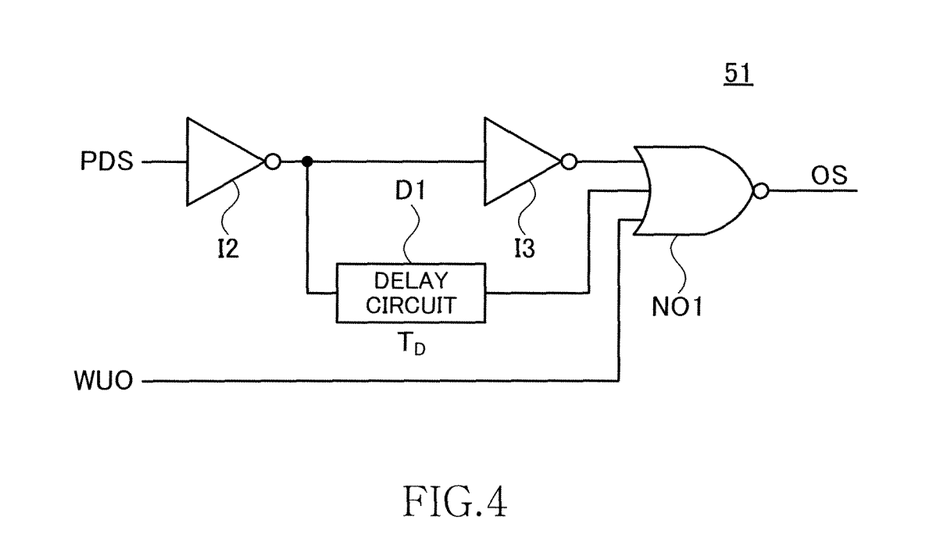
FIG. 4 is a circuit diagram indicative of an embodiment of an internal configuration of the one-shot signal generating unit 51 in the VPERD-stabilization enhancing circuit 50 shown in FIG. 2.

Turning to FIG. 4, the one-shot signal generating unit 51 includes inverters I2 and I3, a delay circuit D1, and a NOR circuit NO1.

The power-down signal PDS described above is supplied to an input terminal of the inverter I2, and an output terminal thereof is connected to an input terminal of the inverter I3 and an input terminal of the delay circuit D1. The delay circuit D1 delays an input signal for a delay time $T_D$ set in advance. The delay time $T_D$ is set as a time shorter than a stabilization time of the internal voltage VPERD. An output of the inverter I3 and an output of the delay circuit D1 are input to the NOR circuit NO1. Accordingly, an output signal OS of the NOR circuit NO1 becomes a one-shot signal of the holding time $T_D$, which rises synchronously with a falling edge of the power-down signal PDS and falls synchronously with a rising edge of an output signal of the delay circuit D1.

The NOR circuit NO1 is a three-input circuit, and the wake-up off signal WUO supplied from the access control circuit 20 shown in FIG. 1 is input to the remaining input terminal. The wake-up off signal WUO is activated (that is, at a high level) or inactivated (that is, at a low level) according to setting of the mode register circuit MRS and the test-mode register circuit TMRS included in the access control circuit 20. Therefore, when the VPERD-stabilization enhancing circuit 50 is not necessary, the output signal OS of the NOR circuit NO1 is fixed to be inactive (low level) by setting the mode register circuit MRS and the test-mode register circuit TMRS to inactivate the wake-up off signal WUO. In other words, generation of the one-shot signal OS by the one-shot signal generating unit 51 is not performed in this case.

Referring back to FIG. 2, the switch 52 includes an N-channel MOS transistor inserted between the power supply line L1 and the grounding wire to which the ground potential VSS is supplied. A control terminal of the switch 52 is connected to an output terminal of the one-shot signal generating unit 51. Therefore, the switch 52 becomes conductive when the one-shot signal OS is activated (when it is at a high level), and becomes non-conductive otherwise.

Because the VPERD-stabilization enhancing circuit 50 has the configuration described above, the power supply line L1 is short-circuited with the grounding wire only for the time $T_D$ synchronously with the activation of the VPERD generating circuit 2a (with the start of generating the internal voltage VPERD). When the power supply line L1 is short-circuited with the grounding wire, the potential of the power supply line L1 is rapidly and greatly reduced. This reduction causes a large amount of drain current to start to flow into the transistor T6 shown in FIG. 3, and then a large quantity of charges start to be supplied to the power supply line L1. After the time $T_D$ has elapsed, the power supply line L1 is disconnected from the grounding wire. Therefore, the potential of the power supply line L1 is immediately returned to the level equal to the reference voltage VREF by the large quantity of charges supplied as described above, and thereafter the potential of the power supply line L1 is stably maintained by operations of the differential amplifier A1. In this manner, because the potential of the power supply line L1 is rapidly and greatly reduced for a while in response to the activation of the VPERD generating circuit 2a, stabilization of the internal voltage VPERD can be achieved in a short time in the semiconductor device 10 regardless of the current consumption amount of the DLL circuit 7.

Figure 5:
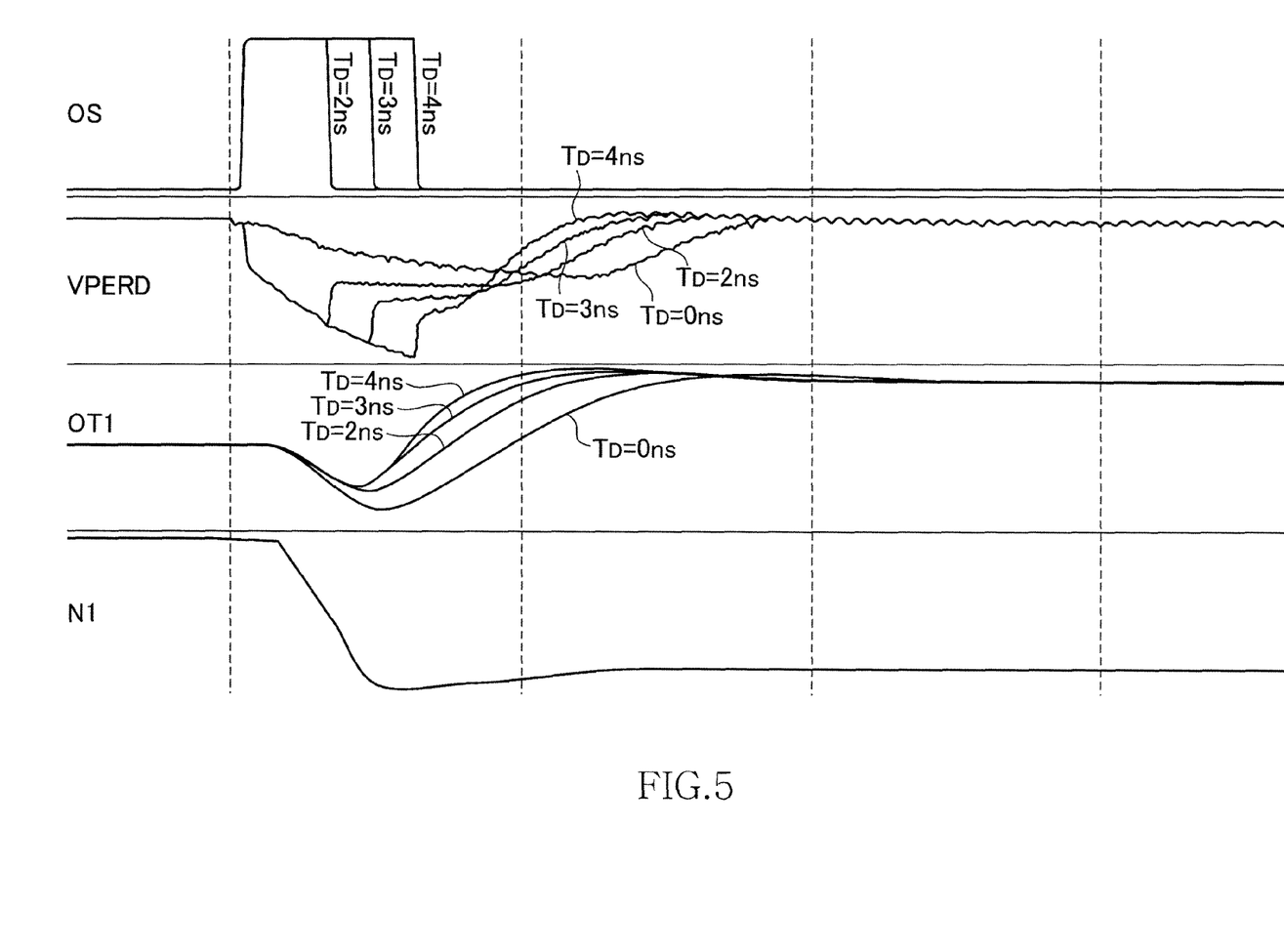
FIG. 5 is indicative of an embodiment of results of actual measurements of respective elements of the semiconductor device 10 shown in FIG. 2.

Turning to FIG. 5, FIG. 5 shows changes with time of the one-shot signal OS, the internal voltage VPERD, the voltage of the output terminal OT1 (FIG. 3) of the differential amplifier A1, and the voltage of the node N1 (FIG. 3). FIG. 5 shows cases where the delay time $T_D$ set in the delay circuit D1 (FIG. 4) is 0 nanosecond, 2 nanoseconds, 3 nanoseconds, and 4 nanoseconds. The case where the delay time $T_D$ is 0 nanosecond is a case of not using the VPERD-stabilization enhancing circuit 50.

As shown in FIG. 5, in the case of not using the VPERD-stabilization enhancing circuit 50, the internal voltage VPERD starts gradually lowering immediately after activation of the VPERD generating circuit 2a, then increases, and finally stabilizes at the level of the reference voltage VREF.

On the other hand, as shown in FIG. 5, in the cases where the delay time $T_D$ is 2 nanoseconds, 3 nanoseconds, and 4 nanoseconds, the internal voltage VPERD starts rapidly lowering upon activation of the one-shot signal OS, and then increases upon inactivation of the one-shot signal OS. In these cases, the internal voltage VPERD reaches a stable state sooner as the delay time $T_D$ is longer, where the stable state means the internal voltage VPERD is at the level of the reference voltage VREF.

As is clear from the graph of potential changes of the output terminal OT1, the potential of the output terminal OT1 starts to increase sooner as the delay time $T_D$ is longer. This is the reason why the internal voltage VPERD reaches the stable state sooner as the delay time $T_D$ is longer. The potential of the output terminal OT1 lowers for a while after activation of the VPERD generating circuit 2a for the following reason. That is, as shown in FIG. 5, a certain period of time is required for the potential of the node N1 to lower to a sufficient level, and during this period of time, the transistor T2 is turned off and thus the external potential VDD is not supplied to the output terminal OT1.

In addition, with reference to FIG. 5, lowering the potentials of the output terminal OT1 and of the node N1 starts with a slight delay relative to activation of the one-shot signal OS. This delay is due to a logic delay of the power-down signal PDS. That is, with reference to FIG. 2, the power-down signal PDS is supplied to both of the VPERD generating circuit 2a and the one-shot signal generating unit 51, and, in a practical transmission path, although not shown, various logic circuits and level converting circuits are provided on an input side of the VPERD generating circuit 2a. Due to passage through these circuits, the power-down signal PDS is supplied to the VPERD generating circuit 2a with a slight delay relative to the timing that the power-down signal PDS is supplied to the one-shot signal generating unit 51. Because of this delay, lowering the potentials of the output terminal OT1 and of the node N1 is slightly delayed relative to activation of the one-shot signal OS. Note that having such a delay is not essential, that is, the activation of the VPERD generating circuit 2a (lowering the potentials of the output terminal OT1 and of the node N1) and the activation of the one-shot signal OS can occur at the same time, or the activation of the one-shot signal OS can occur with a delay relative to the activation of the VPERD generating circuit 2a.

As described above, in the semiconductor device 10 according to the present embodiment, stabilization of the internal voltage VPERD can be achieved in a short time regardless of the current consumption amount of the DLL circuit 7. Consequently, in the semiconductor device 10, jitters of the internal clock signal LCLK1 generated in the DLL circuit 7 are reduced, and jitters of the read data DQ output synchronously with the internal clock signal LCLK2 are also reduced.

Figure 6:
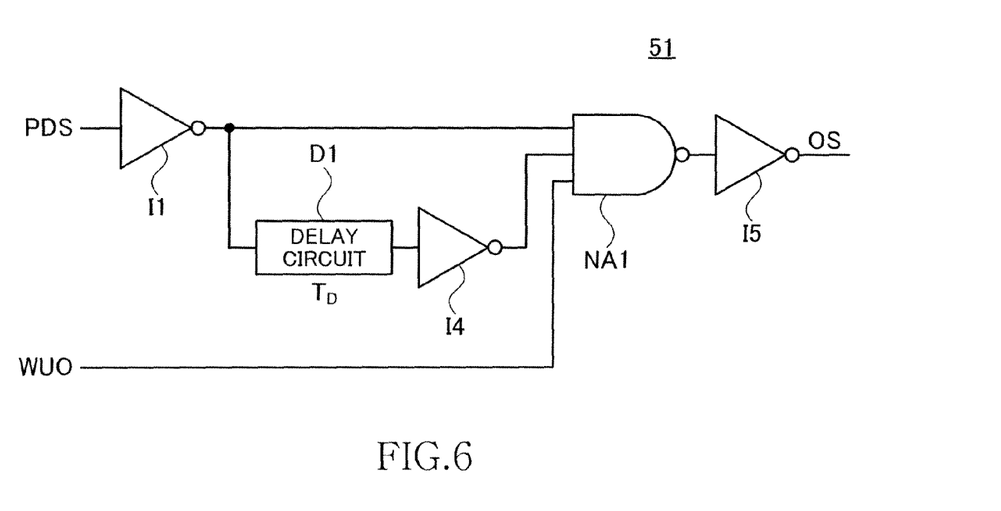
FIG. 6 is a circuit diagram indicative of an embodiment of an internal configuration of the one-shot signal generating unit 51 included in the semiconductor device 10 shown in FIG. 1.

Turning to FIG. 6, the one-shot signal generating unit 51 according to a first modification of the present embodiment includes, instead of the NOR circuit NO1, a NAND circuit NA1 having three inputs. Furthermore, the one-shot signal generating unit 51 according to the first modification includes, instead of the inverter I3, an inverter I4 between the delay circuit D1 and the NAND circuit NA1 and an inverter I5 at an output terminal of the NAND circuit NA1. Other configurations of the semiconductor device 10 according to the first modification are identical to those of the semiconductor device 10 according to the present embodiment.

An one-shot signal OS identical to that generated by the one-shot signal generating unit 51 according to the present embodiment can be generated also by the one-shot signal generating unit 51 according to the first modification.

Figure 7:
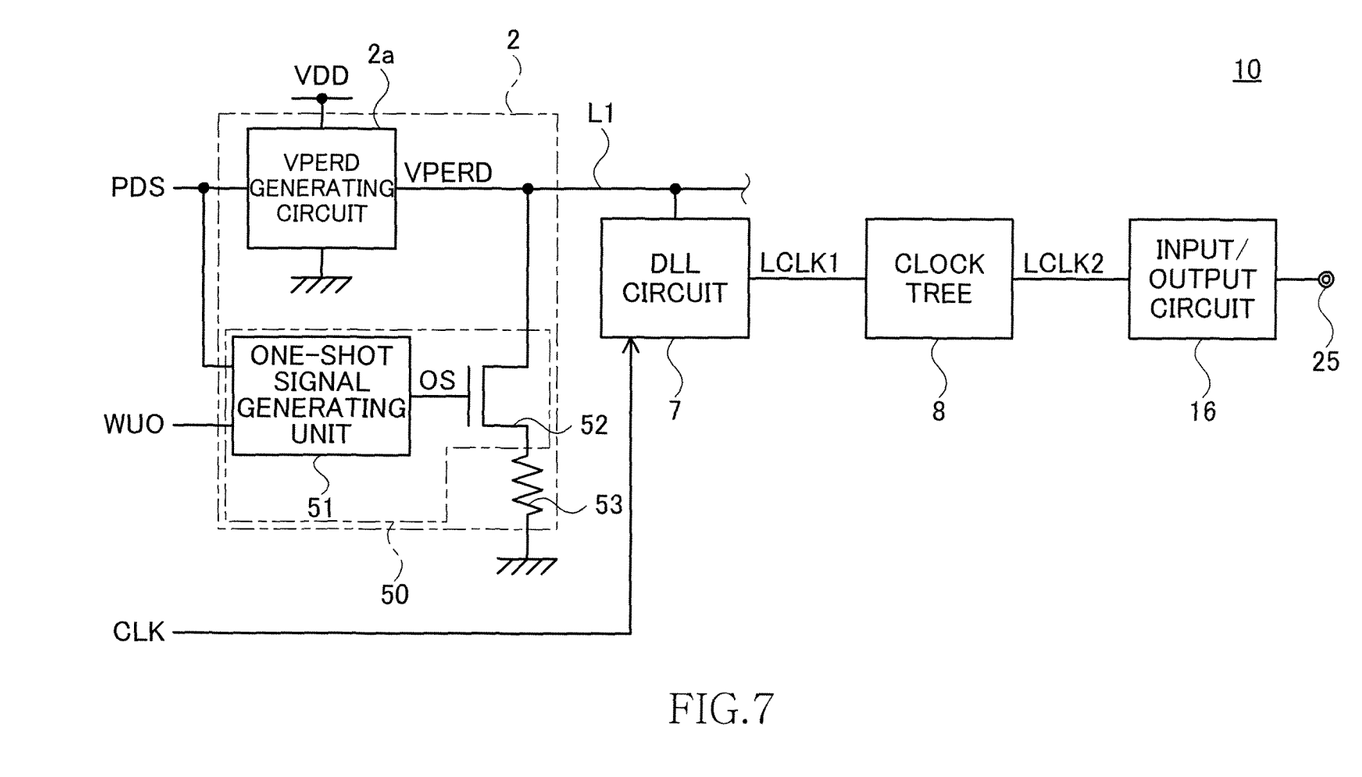
FIG. 7 is a block diagram indicative of an embodiment of the VPERD generating circuit 2a that generates the internal voltage VPERD and other blocks related to the VPERD generating circuit 2a out of circuit blocks included in the semiconductor device 10 shown in FIG. 1.

Turning to FIG. 7, the semiconductor device 10 according to a second modification of the present embodiment is identical to that according to the present embodiment except for the fact that a resistance element 53 is inserted between the switch 52 and the grounding wire.

Fluctuations in a through current (a current that flows from the power supply line L1 to the grounding wire) generated by manufacturing fluctuations of the switch 52 constituted by the N-channel transistor can be suppressed by the insertion of the resistance element 53. With this configuration, manufacturing fluctuations in the decreasing ratio of the potential of the power supply line L1 at the time of forcibly decreasing the potential can be suppressed.

It is needless to mention that the one-shot signal generating unit 51 according to the first modification can be used in the semiconductor device 10 according to the second modification.

Figure 8:
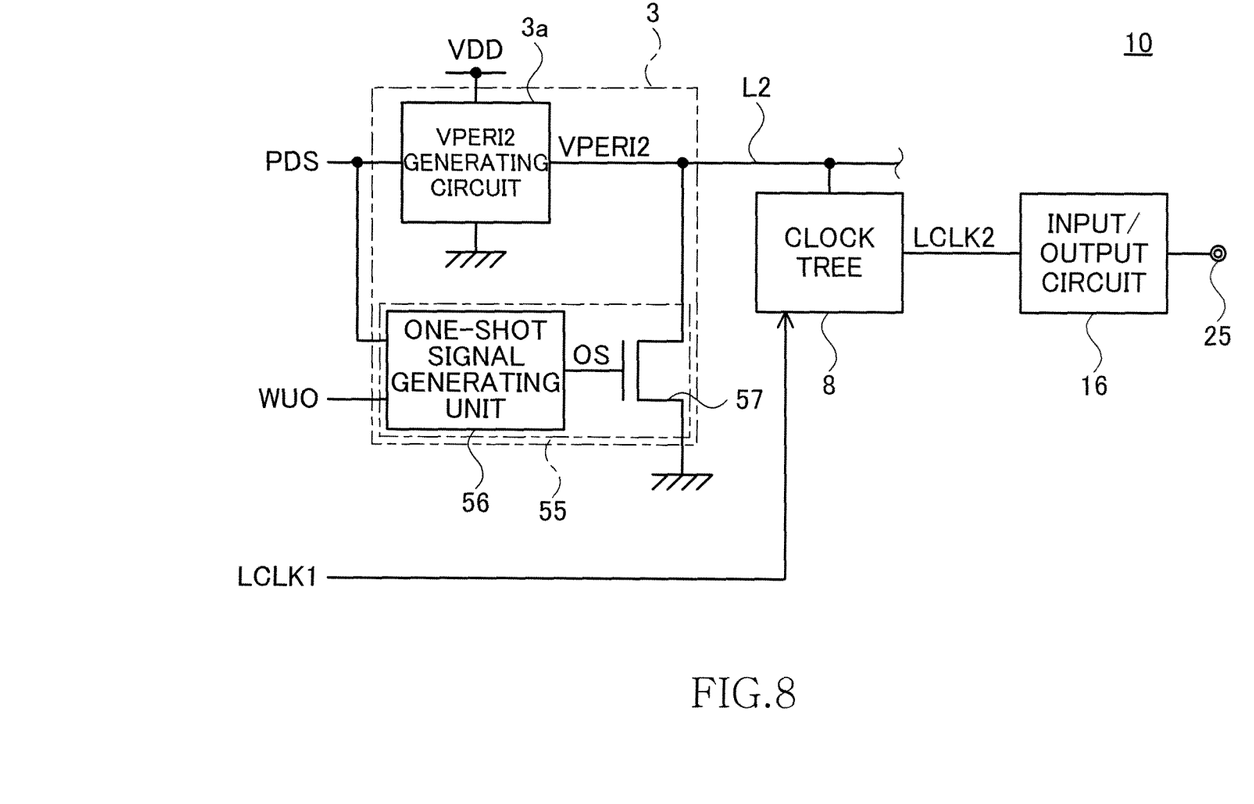
FIG. 8 is a block diagram indicative of an embodiment of the VPERI2 generating circuit unit 3 that generates the internal voltage VPERI2 and other blocks related to the VPERI2 generating circuit unit 3 out of circuit blocks included in the semiconductor device 10 shown in FIG. 1.

The semiconductor device 10 according to the present embodiment is explained again. Turning to FIG. 8, the VPERI2 generating circuit unit 3 (an internal voltage generating circuit unit) according to the present embodiment includes a VPERI2 generating circuit 3a and the VPERI2-stabilization enhancing circuit 55. The VPERI2-stabilization enhancing circuit 55 includes a one-shot signal generating unit 56 (a switch control circuit) and a switch 57.

As shown in FIG. 8, the VPERI2 generating circuit 3a is connected between a power supply line to which the external potential VDD is supplied and a grounding wire to which the ground potential VSS is supplied and generates the internal voltage VPERI2 from the external potential VDD to supply the generated internal voltage VPERI2 to a power supply line L2 (the first power supply line). A detailed internal configuration of the VPERI2 generating circuit 3a is identical to that of the VPERD generating circuit 2a shown in FIG. 3, and therefore detailed explanations thereof will be omitted.

The VPERI2-stabilization enhancing circuit 55 short-circuits the power supply line L2 and the grounding wire for a while when the semiconductor device 10 returns from the power-down mode, thereby stabilizing the internal voltage VPERI2 in a short time. A specific internal configuration and functions of the VPERI2-stabilization enhancing circuit are identical to those of the VPERD-stabilization enhancing circuit 50, and therefore detailed explanations thereof will be omitted.

As described above, in the semiconductor device 10 according to the present embodiment, stabilization of the internal voltage VPERI2 can be achieved in a short time regardless of the current consumption amount of the clock tree 8. Consequently, in the semiconductor device 10, jitters of the internal clock signal LCLK2 having passed through the clock tree 8 are reduced, and accordingly jitters of the read data DQ output synchronously with the internal clock signal LCLK2 are also reduced.

It is apparent that the present invention is not limited to the above embodiments, but may be modified and changed without departing from the scope and spirit of the invention.

For example, in the above embodiment, the configuration of stabilizing both of the internal voltages VPERD and VPERI2 in a short time is employed; however, it is also possible that a configuration of stabilizing only one of these internal voltages in a short time is employed. In addition, as for other types of internal voltages, a configuration of stabilizing these voltages in a short time can be employed.

Furthermore, in the above embodiment, while the first and second modifications thereof have been explained with respect to the internal voltage VPERD, it is needless to mention that similar modifications can be applied to the internal voltage VPERI2.

What is claimed is:

1. A semiconductor device comprising:
   a first power supply line;
   an internal voltage generating circuit receiving a first external power supply voltage and generating an internal voltage in response to a first signal, the internal voltage generating circuit supplying the internal voltage to the first power supply line;
   a second power supply line supplied with a second external power supply voltage lower than the internal voltage;
   a switch connected between the first power supply line and the second power supply line; and
   a control circuit controlling the switch in response to the first signal, the control circuit bringing the switch into a conductive state when the internal voltage generating circuit starts generating the internal voltage, and keeping the switch in the conductive state during a first period of time,
   wherein the internal voltage generating circuit comprises:
      a differential amplifier having a current mirror; and
      a current supply connected between a common source of the differential amplifier and the second power supply line, and
   wherein the current mirror and the current supply are activated in response to the first signal so that the internal voltage generates the internal voltage.

2. The semiconductor device as claimed in claim 1, wherein the control circuit brings the switch from the conductive state into a non-conductive state after elapse of the first period of time since the switch is brought into the conductive state.

3. The semiconductor device as claimed in claim 2, wherein the first signal comprises an inverted signal of an activation signal, and wherein
   the internal voltage generating circuit is configured to start generating the internal voltage in response to a transition of the activation signal from an inactive level to an active level,
   the control circuit generates a control signal that is activated from a first voltage level to a second voltage level and that takes the second voltage level during the first period of time in response to the transition of the activation signal and supplies the control signal to the switch, and
   the switch is brought into the conductive state when the control signal takes the second voltage level and into the non-conductive state when the control signal is deactivated from the second voltage level to the first voltage level.

4. The semiconductor device as claimed in claim 3, wherein the internal voltage generating circuit includes:
   a driver transistor connected between the first power supply line and a third power supply line supplied with the first external power supply voltage; and
   wherein the differential amplifier comprises a first input terminal to which a reference voltage is supplied, a second input terminal connected to the first power supply line, an output terminal connected to a control terminal of the driver transistor,
   wherein the common source is one to which an operation current of the differential amplifier is supplied, the differential amplifier controlling a potential of the output terminal such that a voltage of the second input terminal becomes substantially equal to a voltage of the first input terminal; and
   wherein the current supply comprises a current supply transistor connected between the common source of the differential amplifier and the second power supply line, and the current supply transistor is brought into a conductive state when the activation signal takes the active level and into a non-conductive state when the activation signal takes the inactive level.

5. The semiconductor device as claimed in claim 3, wherein the control circuit does not generate the control signal when the semiconductor device is in a test mode.

6. The semiconductor device as claimed in claim 1, wherein the first period of time is set to be shorter than a stabilization time of the internal voltage.

7. The semiconductor device as claimed in claim 1, wherein the switch includes a transistor.

8. The semiconductor device as claimed in claim 7, further comprising a resistance element that is serially connected to the switch.

9. The semiconductor device as claimed in claim 1, wherein the first signal comprises an inverted signal of an activation signal.

10. The semiconductor device as claimed in claim 9, wherein the control circuit comprises:
    a first inverter which is supplied with the inverted signal;
    a second inverter connected to an output of the first inverter;
    a delay circuit connected to an output of the first inverter and delaying an input signal for a delay time; and
    a NOR circuit which is connected to an output of the second inverter and the delay circuit and generates an output signal for controlling the switch.

11. The semiconductor device as claimed in claim 10, wherein the output signal rises synchronously with a falling edge of the inverted signal.

12. The semiconductor device as claimed in claim 1, wherein, in the internal voltage generating circuit, the current mirror of the differential amplifier comprises first and second transistors and the current supply comprises a current source transistor.

13. The semiconductor device as claimed in claim 12, wherein the differential amplifier comprises a third transistor having a first terminal connected to the gate terminal of the first transistor and the gate terminal of the second transistor, a second terminal connected to the first external power supply voltage, and a third terminal that receives the first signal, and
    wherein an activation of the first and second transistors is dependent upon an activation or deactivation of the third transistor, as controlled based on the first signal.

14. The semiconductor device as claimed in claim 13, wherein the third terminal of the third transistor comprises a gate terminal.

15. The semiconductor device as claimed in claim 13, wherein the current source transistor comprises an NMOS transistor and the first, second, and third transistors comprise PMOS transistors, and wherein:
    when the first signal has a first logic level that activates the current source transistor, the third transistor is inactivated by the first signal and the first and second transistors are activated, and
    when the first signal has a second logic level that deactivates the current source transistor, the third transistor is activated by the first signal and the first and second transistors are inactivated.

16. The semiconductor device as claimed in claim 1, wherein the first signal is supplied to each of the differential amplifier and the current supply.

17. A semiconductor device comprising:
an internal voltage generating circuit having an output node, the internal voltage generating circuit supplying an internal power supply voltage to the output node in response to a first signal, wherein the internal voltage generating circuit comprises a differential amplifier and a current supply connected to a common source of the differential amplifier, and wherein the current supply and the differential amplifier each receive the first signal and are configured to be activated in response to the first signal so that the internal power generating circuit generates the internal power supply voltage when the current supply and the differential amplifier are activated; and
a first circuit supplying a first voltage being lower than the internal power supply voltage to the output node of the internal voltage generating circuit in response to the first signal during a first period of time,
wherein the first circuit includes:
a first node to which the first voltage is supplied; and
a transistor connected between the output node of the internal voltage generating circuit and the first node, and
wherein the first circuit further includes a control signal generating circuit generating a control signal which transits from an inactive level to an active level in response to the first signal, holds the active level during the first period of time from a supply of the first signal, and transits from the active level to the inactive level when the first period of time passes from the supply of the first signal, the control signal generating circuit supplying the control signal to a control terminal of the transistor.

18. The semiconductor device as claimed in claim 17, wherein the first circuit further includes a resistance element connected between the first node and the transistor.

19. The semiconductor device as claimed in claim 17, wherein the internal voltage generating circuit operates on a power supply voltage between a second voltage being higher than the internal power supply voltage and a third voltage being lower than the internal power supply voltage.

20. The semiconductor device as claimed in claim 19, wherein the first voltage is substantially equivalent to the third voltage.

21. The semiconductor device as claimed in claim 17, further comprising an internal circuit operates on the internal power supply voltage, the internal circuit being activated in response to the first signal.

22. The semiconductor device as claimed in claim 17, wherein the differential amplifier comprises first and second transistors arranged as a current mirror controlled based upon the first signal.

23. A device comprising:
a first power supply line;
an internal voltage generating circuit activated in response to a first signal, the internal voltage generating circuit, when activated, supplying an internal power supply voltage to the first power supply line;
a first circuit supplying a first voltage in response to the first signal during a first period of time, the first voltage being lower than the internal power supply voltage to the first power supply line;
a first switch connected between the first power supply line and a second power supply line;
a control circuit controlling the first switch in response to the first signal, the control circuit bringing the first switch into a conductive state when the internal voltage generating circuit starts generating the internal power supply voltage, and keeping the first switch in the conductive state during a first period of time;
a clock generating circuit operating on the internal power supply voltage to generate a first clock signal;
a memory cell array; and
an output circuit outputting data that is supplied from the memory cell array in response to the first clock signal,
wherein the internal voltage generating circuit comprises a differential amplifier that receives the first signal and includes a current mirror, and a second switch connected between a common source of the differential amplifier and the second power supply line that also receives the first signal, and
wherein the current mirror and the second switch are activated in response to the first signal so that the internal voltage generates the internal power supply voltage.

24. The device as claimed in claim 23, wherein the clock generating circuit is activated in response to the first signal.

25. The device as claimed in claim 23, wherein the clock generating circuit generates the first clock signal based on an external clock signal supplied from outside the device.

26. The semiconductor device as claimed in claim 23, wherein the second switch comprises a current source transistor.

* * * * *